(12) United States Patent
Lin et al.

(10) Patent No.: US 11,211,313 B2
(45) Date of Patent: Dec. 28, 2021

(54) LEAD FRAME ARRAY FOR CARRYING CHIPS AND LED PACKAGE STRUCTURE WITH MULTIPLE CHIPS

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Chen-Hsiu Lin, New Taipei (TW); Ming-Kun Weng, New Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 16/586,442

(22) Filed: Sep. 27, 2019

(65) Prior Publication Data
US 2020/0105649 A1   Apr. 2, 2020

(30) Foreign Application Priority Data
Sep. 28, 2018 (CN) .......................... 201811140129.7

(51) Int. Cl.
| H01L 23/495 | (2006.01) |
| H01L 23/31 | (2006.01) |
| H01L 33/62 | (2010.01) |
| H01L 25/075 | (2006.01) |

(52) U.S. Cl.
CPC .... *H01L 23/49575* (2013.01); *H01L 23/3114* (2013.01); *H01L 23/49558* (2013.01); *H01L 25/0753* (2013.01); *H01L 33/62* (2013.01)

(58) Field of Classification Search
CPC ........... H01L 23/49558; H01L 25/0773; H01L 33/52; H01L 33/62; H01L 23/49575; H01L 23/3114; H01L 25/0753; H01L 23/49541; H01L 24/97; H01L 23/49861; H01L 23/49562; H01L 2924/12041
See application file for complete search history.

(56) References Cited

U.S. PATENT DOCUMENTS

| 8,933,548 | B2 * | 1/2015 | Oda ...................... H01L 33/486 |
| | | | 257/676 |
| 9,613,940 | B2 * | 4/2017 | Yu ........................... H01L 23/00 |

\* cited by examiner

*Primary Examiner* — Jasmine J Clark
(74) *Attorney, Agent, or Firm* — Li & Cai Intellectual Property (USA) Office

(57) ABSTRACT

A lead frame array for carrying chips includes a plurality of lead frames. Any four lead frames adjacent to each other and have two pairs of linking bridge groups which are connected any two lead frames adjacent to each other by one of the linking bridge groups. Each linking bridge group has an inner linking bridge, a slanted linking bridge and an outer linking bridge. An LED package structure with multiple chips is further provided, which includes a lead frame formed by cutting the lead frame array.

19 Claims, 8 Drawing Sheets

LEAD FRAME ARRAY FOR CARRYING CHIPS AND LED PACKAGE STRUCTURE WITH MULTIPLE CHIPS

CROSS-REFERENCE TO RELATED PATENT APPLICATION

This application claims the benefit of priority to China Patent Application No. 201811140129.7, filed on Sep. 28, 2018 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a lead frame array and an LED package structure with a lead frame array, and more particularly to a lead frame array for carrying chips and an LED package structure after the lead frame array is packaged.

BACKGROUND OF THE DISCLOSURE

The conventional lead frame for carrying chips is usually made of metal plate in an array manner. After the die attachment process, the wire bonding process, and encapsulation package process, etc., a sawing or trimming process is then performed to separate the inter-linking portions of the lead frame.

Each lead frame has at least two metal pieces which are configured with different electrodes, however, the different metal pieces of the lead frame need to be properly linked by a number of linking bridges, so as to prevent an isolated-island problem from occurring in the trimming or sawing process. In addition, due to development toward miniaturization of the lead frame, the linking bridges linking the metal pieces will need to be properly arranged, or otherwise the metal burr after trimming or sawing may cause a short circuit on the lead frame.

Moreover, the connecting strength between the lead frames also needs to be considered, so as to avoid the problem of positional deviation of the lead frame during the plastic injection of the resin package.

SUMMARY OF THE DISCLOSURE

In response to the above-referenced technical inadequacies, the present disclosure provides a lead frame array for carrying chips, which are well connected to the lead frames adjacent to each other, to solve the isolated-island problem that may occur in the trimming process, and to increase the connecting strength between the lead frames to ensure the stability of plastic injection.

In one aspect, the present disclosure provides a lead frame array for carrying chips, which includes a plurality of lead frame, and each of the lead frames has a functional area defined thereon. Any four of the lead frames adjacent to each other have two pairs of linking bridge assemblies therebetween. Two of the lead frames adjacent to each other are connected by one of the linking bridge assemblies. Each of the linking bridge assemblies has an inner linking bridge, a slanted linking bridge and an outer linking bridge. Four of the inner linking bridges cooperatively and surroundingly define a closed opening. Four of the slanted linking bridges are located respectively between the four of the inner linking bridges and four of the outer linking bridges.

In addition, in response to the above-referenced technical inadequacies, the present disclosure further provides an LED package structure with multiple chips, which solves the isolated-island problem that may happen in the trimming process, and increases the stability of plastic injection, so as to increase the yield rate of the product.

Therefore, the present disclosure has advantages as follows. The present disclosure can solve the isolated-island problem that may happened in the trimming process, and increase the connecting strength between the lead frames to ensure the stability of plastic injection.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
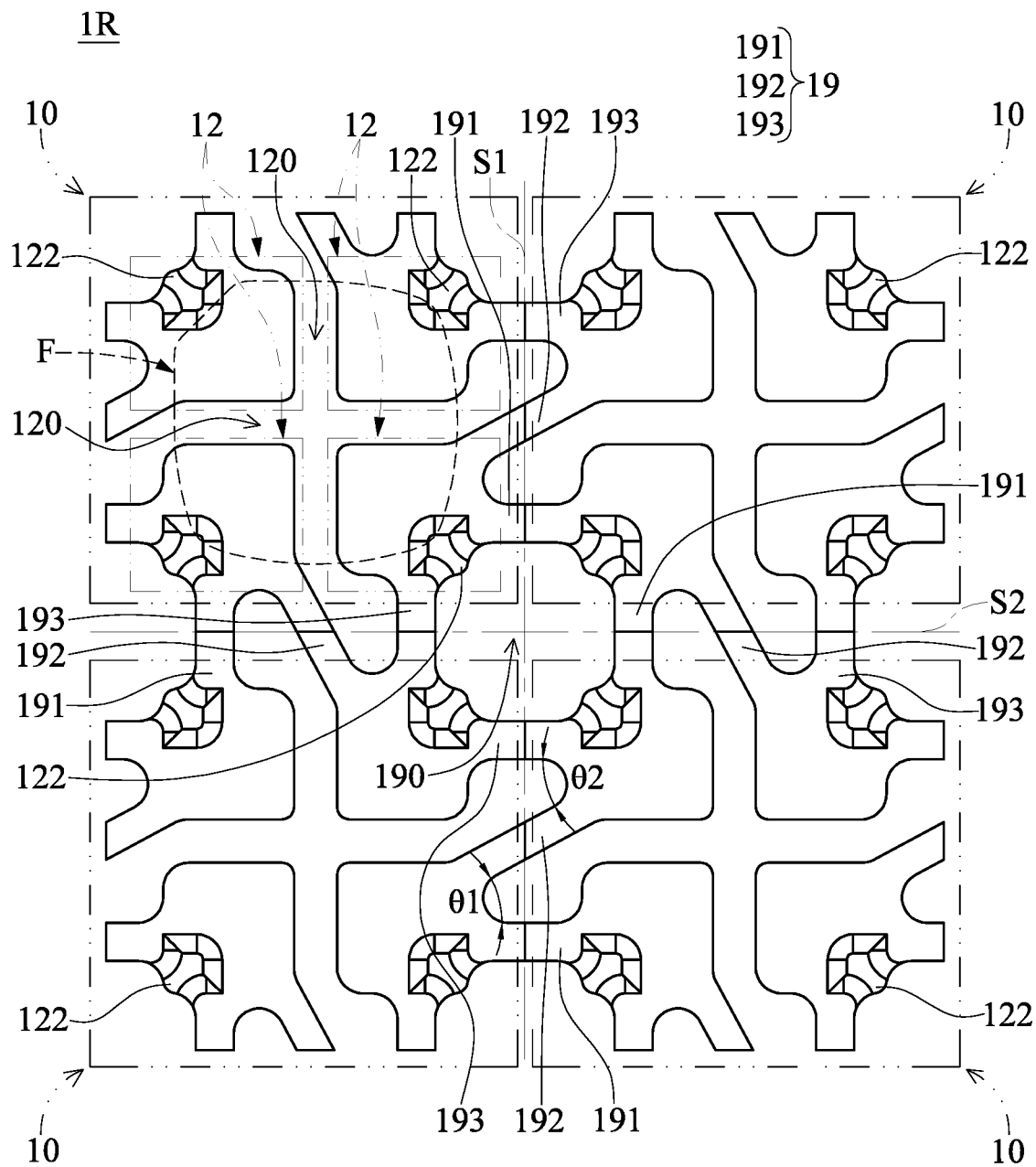
FIG. 1 is a front plan view of a lead frame array for carrying chips of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
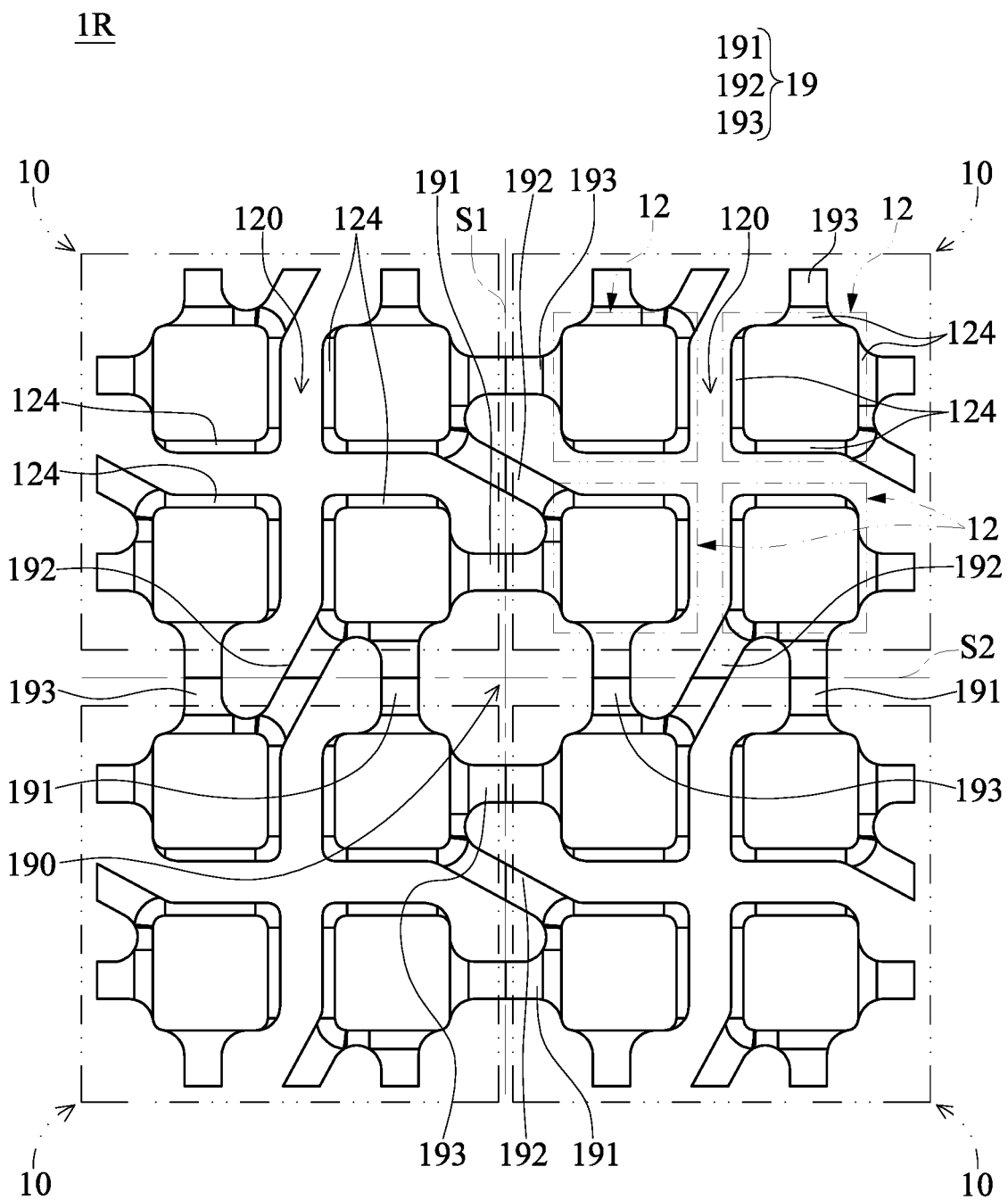
FIG. 2 is a bottom plan view of the lead frame array for carrying chips of the present disclosure.

Referring to FIG. 1 to FIG. 2, a top plan view and a bottom plan view of a lead frame array for carrying chips according to the present disclosure are shown. The present disclosure provides a lead frame array 1R for carrying chips, which has a plurality of lead frames 10. In this embodiment, four lead frames 10 are taken as an example of an array unit and details are described as follows. However, the number of the lead frame 10 is not limited. The lead frames in other positions can have similar structures.

Each of the lead frames 10 has a functional area F, and the functional area F is configured to carry a chip for providing a corresponding function. For example, the functional area F can be formed in a center of the lead frames 10, any four of the lead frames 10 adjacent to each other. And two predetermined cross-shaped scribe lines S1, S2 are defined between any adjacent four of the lead frames 10 and divided thereof into four quadrants.

Reference is made to FIG. 1. The four of the lead frames 10 adjacent to each other have two pairs of linking bridge assemblies 19 respectively traversing the predetermined scribe lines S1, S2. Every two of the lead frames 10 adjacent to each other are connected by one of the linking bridge assemblies 19. Each linking bridge assembly 19 has an inner linking bridge (or first linking bridge) 191, a slanted linking bridge 192 and an outer linking bridge (or second linking bridge) 193. Four of the linking bridges, that are two first linking bridges 191 and two second linking bridges 193, cooperatively and surroundingly define an enclosed opening 190. In this embodiment, the opening 190 is substantially located at a center part of the linking bridge assemblies 19, and could be called as a central opening or an enclosed opening. However, it is not limited thereto, the position and shape of the opening 190 can be adjusted. The opening 190 is located in a central position of four lead frames 10 adjacent to each other and is substantially square-shaped. As shown in FIG. 1 and FIG. 2, the opening 190 is substantially quadrilateral-shaped. The four linking bridge assemblies 19 are respectively located at a top side, a bottom side, a left side and a right side of the opening 190. The four slanted linking bridges 192 are located respectively between the four inner linking bridges 191 and the four outer linking bridges 193. Each linking bridge assembly 19 is substantially arranged in a shape of N or Z. According to the present disclosure, the lead frame array 1R forms an enclosed opening 190 by the two pairs of linking bridge assemblies 19, so as to effectively solve the isolated-island problem that may occur in the trimming process. The Z-shaped or N-shaped linking bridge assemblies 19 can effectively increase the connecting strength of the lead frame array 1R to ensure the stability of injection molding.

In this embodiment, all linking bridge assemblies 19 are arranged in the same manner. Furthermore, the four linking bridge assemblies 19 are arranged around the closed-shaped opening 190 sequentially in a clockwise direction, but no limited. For example, it can be also sequentially arranged in a counterclockwise direction. As shown in FIG. 1, two of the linking bridge assemblies 19 at two sides of the opening 190 are substantially N-shaped and two of the linking bridge assemblies 19 in front of and in the rear of the opening 190 are substantially Z-shaped.

Referring to FIG. 1, the lower one of the linking bridge assemblies 19 is taken as an example as follows. In this embodiment, each slanted linking bridge 192 of the linking bridge assembly 19 respectively forms a first angle θ1 with the inner linking bridge 191, and a second acute angle θ2 with the outer linking bridge 193, wherein the first angle θ1 and the second angle are acute angle. In addition, the inner linking bridges 191 and the outer linking bridges 193 are substantially perpendicular to the predetermined scribe lines S1, S2, and may also be referred to as vertical linking bridges. The inner linking bridges 191 and the outer linking bridges 193 at two opposite sides of the opening 190 are parallel to each other. Furthermore, the first angle θ1 and the second angel θ2 are equal and formed as alternate interior angles, preferably.

Each lead frame 10 of this embodiment has four substrates 12, and each of the substrates 12 is substantially square. A cross-shaped partition passage 120 is formed between the four substrates 12. Each side of the lead frame 10 is connected to one of the inner linking bridges 191, one of the slanted linking bridges 192 and one of the outer linking bridges 193. Each slanted linking bridge 192 has two ends which respectively connect to the corners of two of the substrates 12. Two sides of any one of the substrateds 12 connect to an end of the inner linking bridge 191 and an end of the outer linking bridge 193, respectivley.

More specifically, none of the ends of the slanted linking bridges 192 are connected to any end of the inner linking bridges 191, nor connected to any end of the outer linking bridges 193. Therefore, when the lead frame array 1R is trimmed along the predetermined scribe lines S1, S2, the remaining ones of the slanted linking bridge 192, the inner linking bridge 191 and the outer linking bridge 193 can be precisely separated. According to this embodiment, it is preferable that a free end of the slanted linking bridge 192, a free end of the inner linking bridge 191 and a free end of the outer linking bridge 193 could be separated in an equidistant manner. By the above-designed structure, this embodiment is not affected by the cutting tolerance.

In this embodiment, a width of the inner linking bridge 191 or the outer linking bridge 193 along the predetermined scribe line (S1 or S2) is about one-fourth of a length of the side of the substrates 12. Preferably, the width of the inner linking bridge 191 or the outer linking bridge 193 along the predetermined scribe line (S1 or S2) is smaller than one half of a length of the side of the substrates 12. Further, the inner linking bridge 191 and the outer linking bridge 193 preferably extends from two sides of the same substrate 12, respectively. In this embodiment, the inner linking bridge 191 and the outer linking bridge 193 extends from the corner of the substrates 12 which formed with a blind concave portion 122. The term "blind" means is partially etched to remove a part of the substrate 12. For example, a half-height of the substrate in the blind concave portion 122 is removed. Therefore, the free end of the of the inner linking bridge 191 or the free end of the outer linking bridge 193 in the identical lead frame 10 could be much more separated from the free end of the slanted linking bridge 192.

Further, the positions of the linking bridges (191, 192, 193) are preferably far away the functional region F. Through such separation of the ends of the linking bridges, such structure arrangement can avoid a short circuit of the lead frame after trimming. In the conventional art, the cutting/slicing process may cause the lead frames being connected due to the linking bridges are too close, or the cutting is declined. In order to better combine the lead frame 10 and insulated package material, the lead frame array 1R of the present embodiment has a top surface (as shown in FIG. 1) and a bottom surface opposite to the top surface (as shown in FIG. 2). Referring to FIG. 1, the top surface of each lead frame 10 has a blind concave portion 122 which is formed on an outer corner of each substrate 12. The "blind" means that the metal piece is processed with partial etching to remove a part of the material, and usually one-half of the thickness of the metal piece is removed. Each lead frame 10 has four blind concave portions 122 respectively formed on four outer corners of the four substrates 12. In this embodiment, the blind concave portion 122 is extended from the corner of the top surface of the substrate 12 toward a center of the substrate 12 in a concave manner. Each blind concave portion 122 substantially covers one-fourth area of the substrate 12. In detail, each blind concave portion 122 extends into the functional area F of the lead frame 10.

Figure 3:
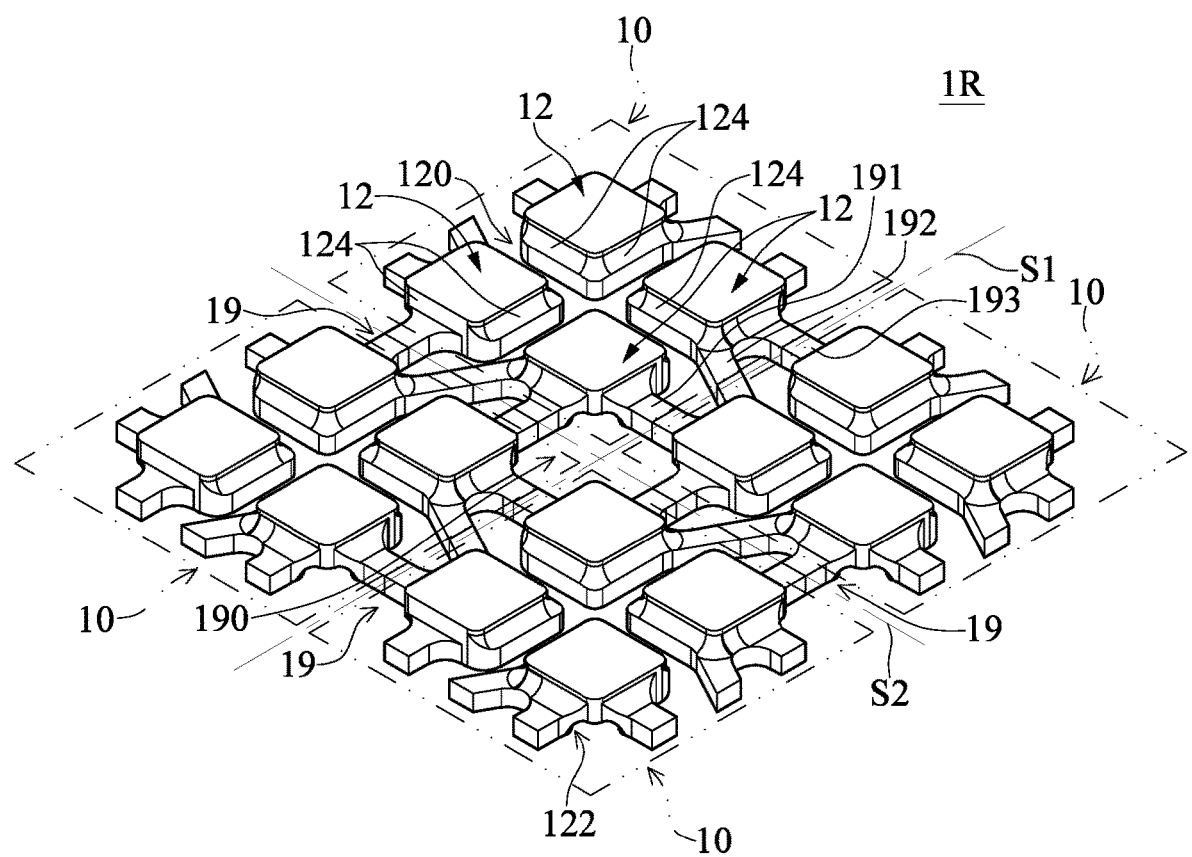
FIG. 3 is a bottom perspective view of the lead frame array for carrying chips of the present disclosure.

Reference is made to FIG. 2 and FIG. 3. In this embodiment, each substrate 12 further has a blind stepped structure 124 which is formed on a bottom surface of inner edges of the substrate 12 along the partition passage 120. In addition, it is preferable that a part of the linking bridge assembly 19 is simultaneously etched during the etching process of this embodiment. In other words, the thicknesses of the inner linking bridge 191, the slanted linking bridge 192 and the outer linking bridge 193 are equal to the thickness of the blind concave portion 122. All thicknesses of the linking bridge assemblies 19 are smaller than the thickness of the substrate 12. Therefore, this embodiment can reduce the burr when trimming the linking bridge assembly 19.

Figure 4:
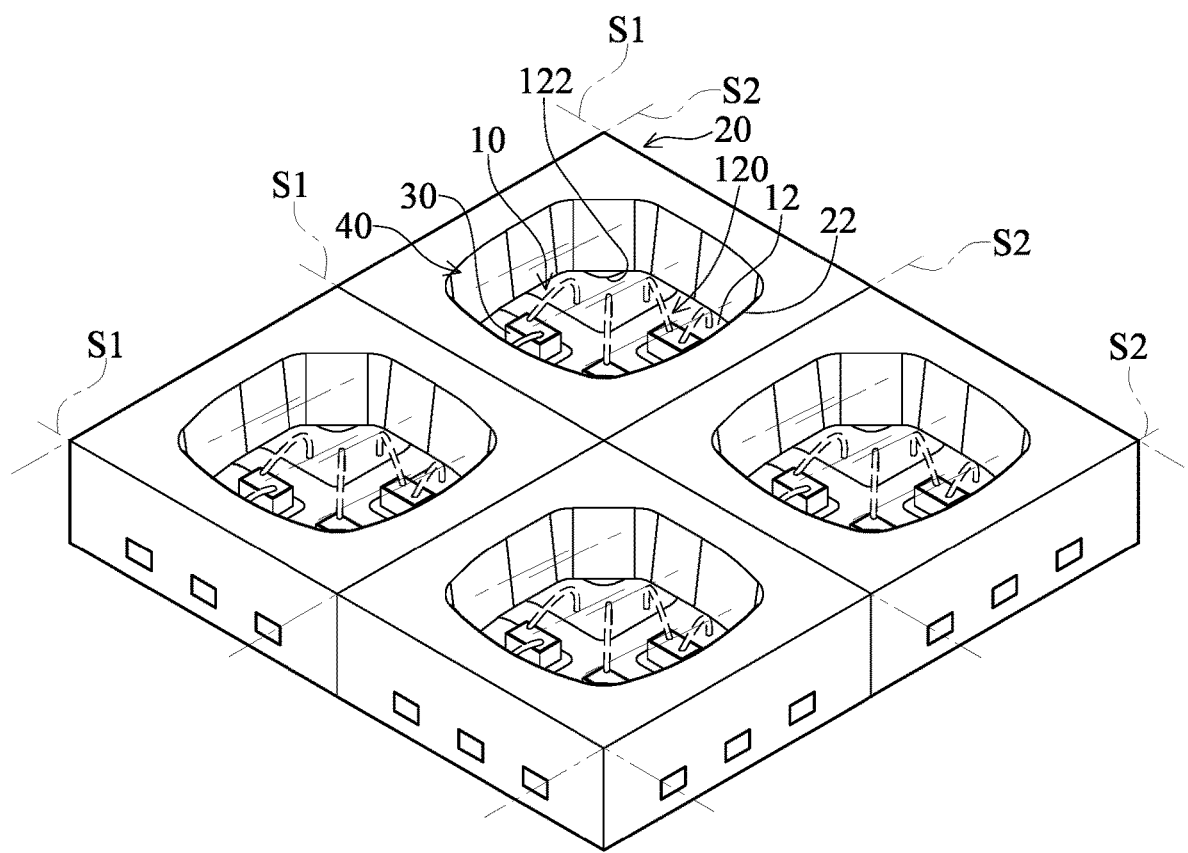
FIG. 4 is a perspective view of the lead frame packaging array for carrying chips without slicing of the present disclosure.
Figure 5:
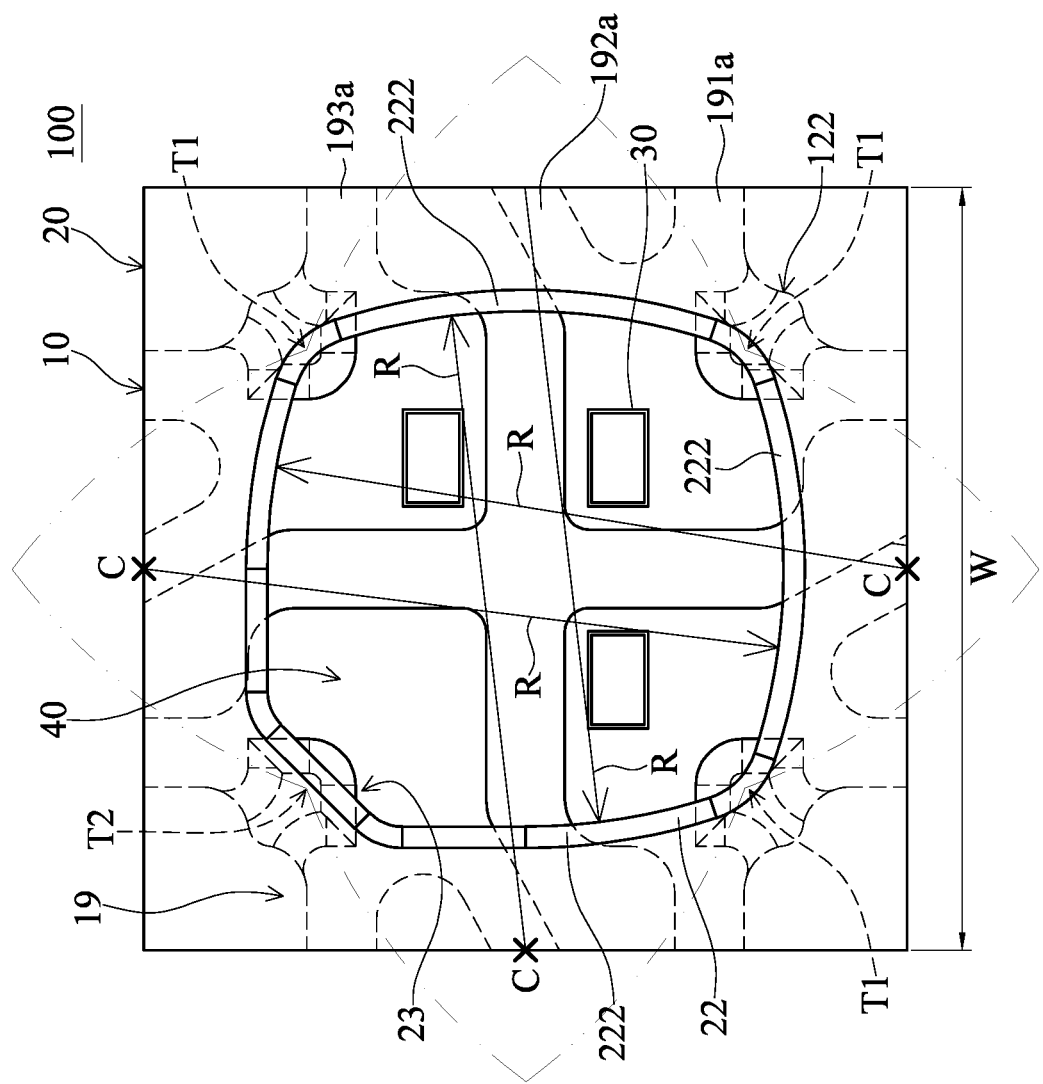
FIG. 5 is a top view of an LED package structure with chips of the present disclosure.
Figure 7:
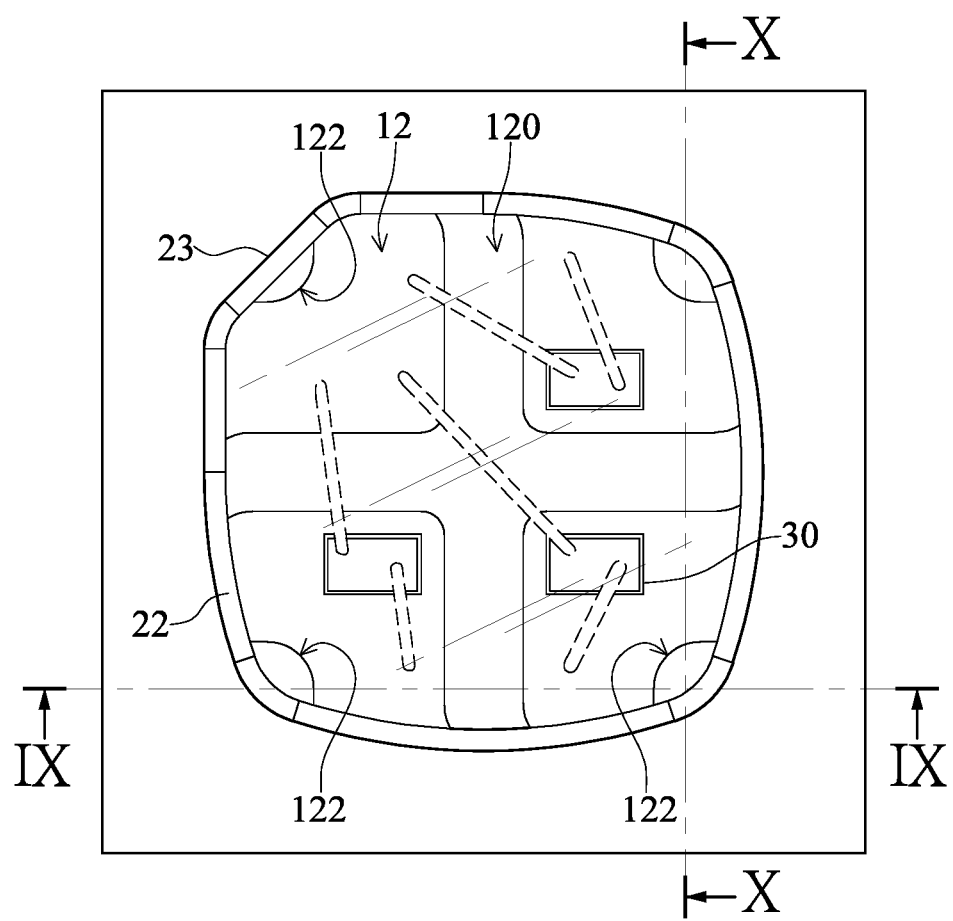
FIG. 7 is a top view of the LED package structure with chips of the present disclosure.
Figure 8:
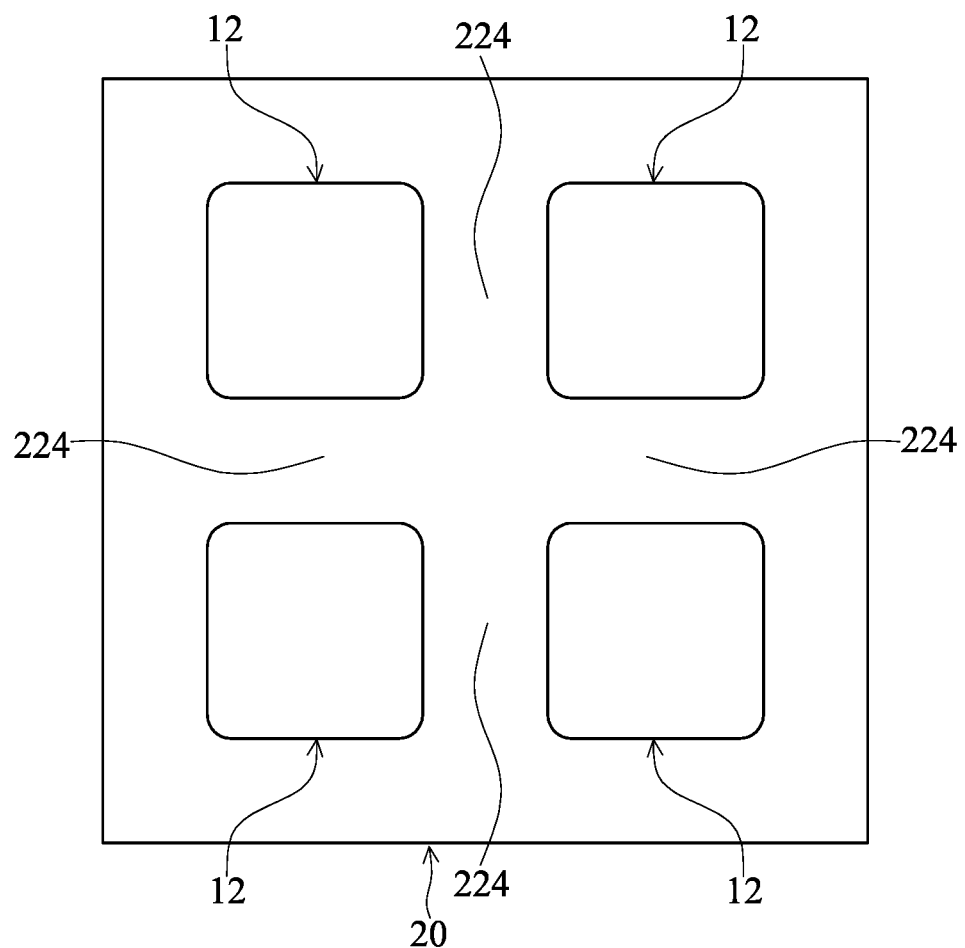
FIG. 8 is a bottom view of the LED package structure with chips of the present disclosure.

As shown in FIG. 4, after an encapsulation procedure, the lead frame array 1R are encapsulated as the lead frame packaging array, the chips are fixed on the lead frame 10 (such as by being bonded with metal wire, if necessary), wherein the linking bridge assembly 19 on each side of the lead frame 10 encapsulated by insulated encapsulant 20 has three linking bridges which can increase the linking strength between the substrates 12. After the lead frame array 1R of FIG. 1 is processed with the encapsulation procedure, as shown in FIG. 4, the lead frame packaging array is then trimmed along the predetermined scribe lines S1, S2, as shown in FIG. 5, so as to form an LED package structure 100 with multiple chips, or simply referred to herein as an LED package structure 100. The LED package structure 100 includes the lead frame 10, an insulated encapsulant 20, a plurality of chips 30, and a transparent filling material 40. The lead frame 10 can include three lighting chips, such as a wavelength of 620 to 630 nm for red light, a wavelength of 520 to 535 nm for green light, and a wavelength of 447 to 472 nm for blue light, respectively. However, the embodiment is not limited thereto, and can be designed according to requirements. The lighting chips can be lighted independently, or lighted together to mix into a white light. It should be noted that, the bonding wires shown in FIG. 4 and FIG. 7 are shown in dotted lines, which means that the bonding wires can be omitted and applied to some chips that do not require bonding wires, such as flip-type chip. The LED chips of the present disclosure are not limited to being horizontal type chips. The substrate 12 is exposed outside a bottom side of the insulated encapsulant 20 and can be used as an electrode, as shown in FIG. 8. As shown in FIG. 5, each substrate 12 has three conductive leads 191a, 192a, 193a outwardly extending along one plane. More specifically, three conductive leads 191a, 192a, 193a extend outwardly from two sides of each of the substrates 12 along the same plane, and are the remaining parts of the inner linking bridge 191, the slanted linking bridge 192 and the outer linking bridge 193 exposed outside the insulated encapsulant 20 after trimming. Two of the conductive leads have the same polarity. The chips 30 are disposed on the functional area of the top surface of each of the lead frame 10. The insulated encapsulant 20 covers the lead frame 10. Furthermore, the insulated encapsulant 20 encapsulates of the inner linking bridge 191, the slanted linking bridge 192, the outer linking bridge 193 and the closed opening 190 of the pair of linking bridge assemblies 19. The insulated encapsulant 20 can be epoxy resin, such as epoxy molding compound (EMC) material. The insulated encapsulant 20 has a plurality of windows through which chips exposed and defined by a plurality of concave-shaped reflective portions 22, and the transparent filling material 40 is filled in the plurality of windows of the reflective portions 22. However, the present disclosure is not limited thereto. For example, the transparent filling material can be omitted. Probably, the insulated encapsulant can be made of transparent material and covers the chips and the lead frame.

Figure 6:
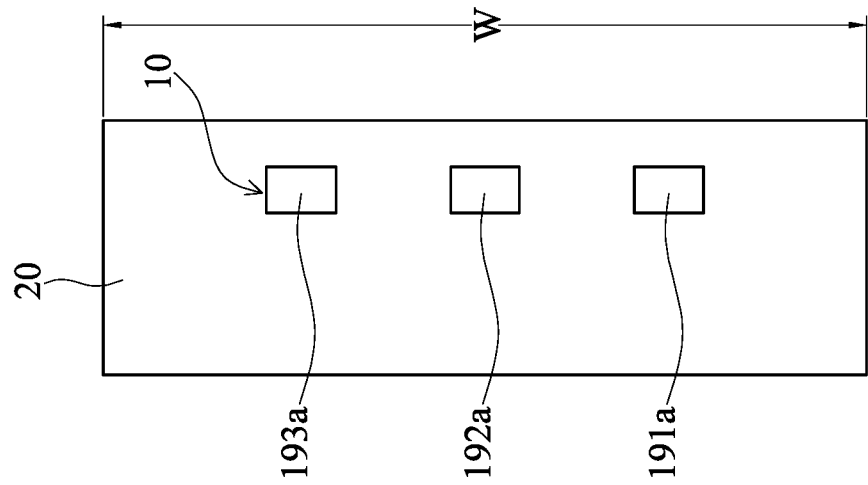
FIG. 6 is a right side view of the LED package structure with chips of the present disclosure.

Reference is made to FIG. 5 and FIG. 6. The LED package structure 100 has two pairs of arced surfaces 222 which are connected to each other to form the reflective portion 22 and four intersection points (or called as intersection portions) (T1, T2). The four arced surfaces 222 have the same arc radius R, but the centers of the circles are different. Three of the intersection points T1 respectively form a chamfer, and the intersection point T2 has a polarity identification portion 23. The shape of the polarity identification portion 23 can be a chamfered corner, but is not limited thereto. The shape of the polarity identification portion 23 is only required to be different from the shape of the intersection points T1. The different geometric shape on the intersection point T2 provides an identification direction for the LED package structure 100, which can overcome the obstacle relating to the design of a small-size mold cavity.

A total span of one of the linking bridge assemblies 19 along the predetermined scribe line S1 or S2 is substantially equal to a side length of the functional area F, which is a projected length of the arced surfaces 222 on an adjacent side of the LED package structure 100. Trimming ends of the linking bridge assemblies 19 along the predetermined scribe line S1 or S2 are equidistantly spaced.

Reference is made to FIG. 5 to FIG. 6. The reflective portion 22 of this embodiment is specially designed. In detail, the insulated encapsulant 20 is in shape of a square, and each side length is exemplified as W. The circle centers C of the four arced surfaces 222 are respectively located on a central position of four side edges of the insulated encapsulant 20. The arc radius R is smaller than the side length W of the insulated encapsulant 20. The range of arc radius R can expose parts of the blind concave portions 122, but not all of the blind concave portions 122. The four intersection points (T1, T2) are all located within the range of the blind concave portion 122, so that the insulated encapsulant 20 and the transparent filling material 40 are combined together in the blind concave portions 122 to provide a stronger combining strength with the lead frame 10. In other words, in view of FIG. 5, the arc radius R is equal to the side length W of the insulated encapsulant 20 minus a predetermined length. The predetermined length is larger than a half-length of the vertical linking bridge (such as inner linking bridge 191 or outer linking bridge 193), and is smaller than the sum of the length of the vertical linking bridge and the length of the blind concave portion 122. According to this embodiment, for example, the side length W of the insulated encapsulant 20 is about 1.2 mm, and the predetermined length is about 0.1 mm.

The arced surface 222 of the present disclosure is not limited to the above-mentioned arc, and can be an elliptical arced surface or a parabola arced surface. The geometric shape of the reflective portion 22 is preferably a conventional circular reflective portion or a rectangular reflecting portion. The reflective portion 22 of this embodiment has a functional area larger than a functional area of the conventional circular reflective portion. In other words, this embodiment has a larger area for die bonding. The reflection effect of this embodiment is better than the reflection effect of the convention rectangular reflective portion. The functional area in the reflective portion 22 of this embodiment has a maximum area of about 90% area of the LED package structure 100.

Figure 9:
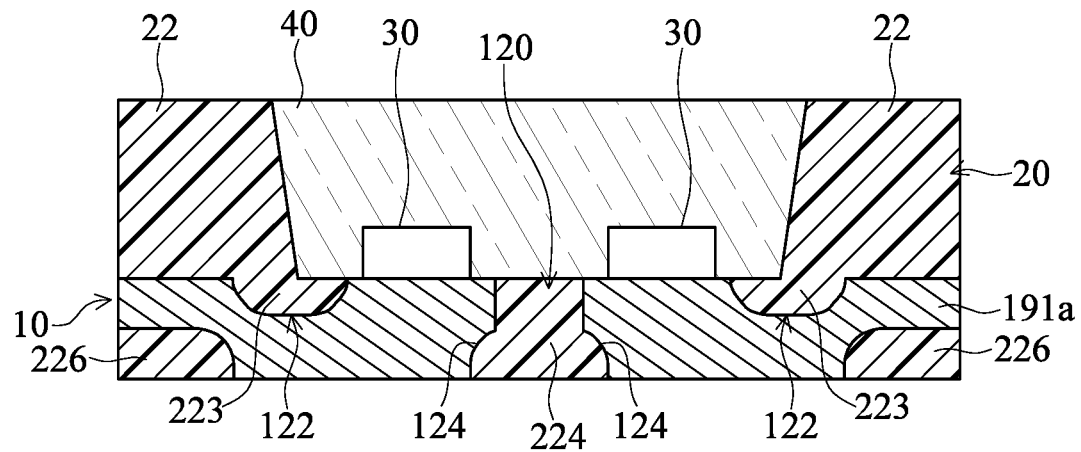
FIG. 9 is a cross-sectional view along a line IX-IX in FIG. 7 of the present disclosure.
Figure 10:
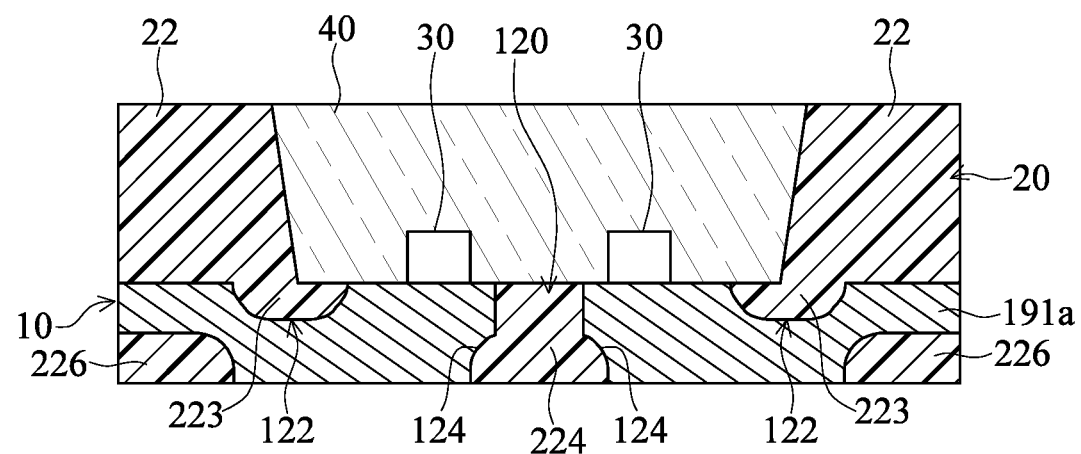
FIG. 10 is a cross-sectional view along a line X-X in FIG. 7 of the present disclosure.

Reference is made to FIG. 7, FIG. 9 and FIG. 10. In this embodiment, the insulated encapsulant 20 fills the four blind concave portions 122. The insulated encapsulant 20 has four extending parts 223 which extends into the four intersection points (T1, T2) on the top surface of the four substrates 12. The extending part 223 extends downwardly from an inner side of the upper-half of the reflective portions 22 and fills each of the blind concave portions 122. In addition, as shown in FIG. 7, the cross-shaped partition passage 120 is formed between the four substrates 12. As shown in FIG. 9 and FIG. 10, each inner edge of the substrates 12 has a blind stepped structure 124 adjacent to the bottom surface along the cross-shaped partition passage 120. The insulated encapsulant 20 fills between adjacent two of the blind stepped structures 124 to form an insulated-partition part 224. In a cross-sectional view, the insulated-partition part 224 has a structure in which the upper-half is narrow and the lower-half is wide. Such a structure has advantage of increasing a distance from an exterior to the reflective portion 22, because the insulated encapsulant 20 is filled in the blind stepped structure 124. In other words, the structure can slow the speed of the outside moisture entering into the interior of the LED package structure 100. Therefore, the reliability and life-span of the products can be increased. In addition, the insulated encapsulant 20 further includes a peripheral-extending part 226 which extends into the bottom corners of the four substrates 12 from a periphery of the reflective portion 22. The peripheral-extending part 226 is flushed with the bottom surface of the substrate 12.

In conclusion, the present disclosure has advantages and functions as follows. Any adjacent four of the lead frames 10 has two pairs of linking bridge assemblies that are Z-shaped or N-shaped, and cooperatively and surroundingly define a closed-type opening 190. Such structure can not only effectively solve the isolated-island problem that may occur in the trimming process, but also increase the connecting strength between the lead frames 10 to ensure the stability of injection molding. The lead frame 10 is partially etched to form blind structures, wherein the blind concave portion 122 can increase the combining strength between the insulated encapsulant 20 and the lead frame 10, and the blind stepped structure 124 along the cross-shaped partition passage 120 can reduce moisture permeating thereinto. The reflective portion 22 is composed of two pairs of opposite arced surfaces 222 connected to each other, which not only provides a larger functional area but also a better reflection effect. A corner of the reflective portion 22 is formed with different geometric shape, so as to enable identification of the direction of the LED package structure 100.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A lead frame array for carrying chips, comprising:
a plurality of lead frames, each of the lead frames having a functional area defined thereon; wherein any adjacent four of the lead frames have two pairs of linking bridge assemblies therebetween, two of the lead frames adjacent to each other are connected by one of the linking bridge assemblies;
wherein each of the linking bridge assemblies has a first linking bridge, a slanted linking bridge, and a second linking bridge parallel to the first linking bridge, the slanted linking bridge is located between the first linking bridge and the second linking bridge, wherein an enclosed opening is defined among the four adjacent lead frames by two of the first linking bridges and two of the second linking bridges.

2. The lead frame array for carrying chips according to claim 1, wherein each of the lead frames has four substrates, and a cross-shaped partition passage formed between the four substrates; each of the lead frames has four sides respectively having one of the first linking bridges, one of the slanted linking bridges and one of the second linking bridges.

3. The lead frame array for carrying chips according to claim 2, wherein a thickness of the linking bridge assembly is smaller than a thickness of the substrate.

4. The lead frame array for carrying chips according to claim 3, wherein each one of the four substrates in a common one of the lead frames has a part connecting an end of one of the slanted linking bridges, a side connecting an end of one of the first linking bridges, and another side connecting an end of one of the second linking bridges.

5. The lead frame array for carrying chips according to claim 2, wherein the lead frame array has a top surface and a bottom surface opposite to the top surface, each of the lead frames has a plurality of concave portions respectively formed on outer corners of the top surface of the four substrates.

6. The lead frame array for carrying chips according to claim 5, wherein each of the substrates respectively forms a stepped structure along the partition passage on an inner side of the substrate adjacent to the bottom surface of the lead frame array.

7. The lead frame array for carrying chips according to claim 2, wherein the lead frame array has a top surface and a bottom surface opposite to the top surface, each of the substrates respectively forms a stepped structure along the partition passage on an inner side of the substrate adjacent to the bottom surface of the lead frame array.

8. The lead frame array for carrying chips according to claim 5, wherein each of the concave portions substantially covers one-fourth area of the substrate, each of the concave portions extends into the functional area of the lead frame.

9. The lead frame array for carrying chips according to claim 1, wherein each of the linking bridge assemblies respectively forms an included acute angle between the slanted linking bridge and the first linking bridge, and another included acute angle between the slanted linking bridge and the second linking bridge.

10. The lead frame array for carrying chips according to claim 1, wherein each of the linking bridge assemblies is substantially Z-shaped or N-shaped.

11. A lead frame packaging array, comprising:
a plurality of chips disposed on the functional area of each of the lead frames of the lead frame array as claimed in claim 1;
an insulated encapsulant having a plurality of windows through which the chips are exposed on a corresponding one of the lead frames and encapsulating the linking bridge assemblies; and
a transparent filling material being filled into the plurality of windows defined by the insulated encapsulant of the corresponding lead frame.

12. The lead frame packaging array according to claim 11, wherein each of the lead frames includes four substrates, and each of the substrates has three conductive leads extending outwardly in a common plane and formed by the first linking bridge, the slanted linking bridge and the second linking bridge.

13. An LED package structure with multiple chips, comprising:
a plurality of chips;
a lead frame including four substrates, each of the substrates extend outwardly to form three conductive leads, the lead frame having a top surface and a bottom surface opposite to the top surface, wherein the chips are disposed on the top surface of the lead frame; and
an insulated encapsulant covering the lead frame, and having four sides;
wherein the plurality of the conductive leads of the lead frame are exposed outside the insulated encapsulant, wherein each side of the insulated encapsulant has three of the conductive leads, and two of the conductive leads exposed to a common side of the insulated encapsulant have the same polarity.

14. The LED package structure with multiple chips according to claim 13, wherein the insulated encapsulant has a concave-shaped reflective portion, and the plurality of chips are disposed within the concave-shaped reflective portion of the insulated encapsulant.

15. The LED package structure with multiple chips according to claim 14, further comprising a transparent filling material filled into the reflective portion and covering the plurality of chips.

16. The LED package structure with multiple chips according to claim 14, wherein the reflective portion has two pairs of arced surfaces connected to each other to form four intersection portions.

17. The LED package structure with multiple chips according to claim 16, wherein three of the intersection portions respectively form a chamfer, and one of the intersection portions has a polarity identification portion.

18. The LED package structure with multiple chips according to claim 16, wherein the insulated encapsulant is square-shaped, the centers of the four arced surfaces are respectively located at central positions of four sides of the insulated encapsulant.

19. The LED package structure with multiple chips according to claim 14, wherein the insulated encapsulant has four extending parts respectively extending from the reflective portion toward the four intersection portions and the top surfaces of the four substrates.

\* \* \* \* \*